US012604524B2

(12) United States Patent
Zhang

(10) Patent No.: US 12,604,524 B2
(45) Date of Patent: Apr. 14, 2026

(54) ARRAY SUBSTRATE WITH SECOND COMMON ELECTRODE LAYER AND PREPARATION METHOD THEREOF, AND DISPLAY PANEL

(71) Applicant: Shenzhen China Star Optoelectronics Semiconductor Display Technology Co., Ltd., Guangdong (CN)

(72) Inventor: Yi Zhang, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 600 days.

(21) Appl. No.: 17/614,337

(22) PCT Filed: Oct. 26, 2021

(86) PCT No.: PCT/CN2021/126434
§ 371 (c)(1),
(2) Date: Nov. 25, 2021

(87) PCT Pub. No.: WO2023/065378
PCT Pub. Date: Apr. 27, 2023

(65) Prior Publication Data
US 2024/0030230 A1     Jan. 25, 2024

(30) Foreign Application Priority Data

Oct. 18, 2021     (CN) .......................... 202111211215.4

(51) Int. Cl.
*H10D 86/01*          (2025.01)
*H10D 86/40*          (2025.01)
*H10D 86/60*          (2025.01)
(52) U.S. Cl.
CPC ......... *H10D 86/60* (2025.01); *H10D 86/0221* (2025.01); *H10D 86/441* (2025.01)

(58) Field of Classification Search
None
See application file for complete search history.

(56) References Cited

U.S. PATENT DOCUMENTS

2015/0069341 A1     3/2015   Kim et al.
2016/0187692 A1*    6/2016   Woo ...................... H01L 23/522
                                                       438/151
(Continued)

FOREIGN PATENT DOCUMENTS

CN          104795407          7/2015
CN          105070727          11/2015
(Continued)

OTHER PUBLICATIONS

International Search Report and the Written Opinion Dated Jun. 23, 2022 From the International Searching Authority Re. Application No. PCT/CN2021/126434 and Its Translation Into English. (17 Pages).

(Continued)

*Primary Examiner* — Sue A Purvis
*Assistant Examiner* — Seyon Ali-Simah Punchbeddell

(57)          ABSTRACT

The present invention relates to an array substrate and a preparation method thereof, and a display panel. The array substrate of the present invention includes a substrate, a thin film transistor layer, a planarization layer, a first common electrode layer, a metal unit, and a second common electrode layer. According to the present invention, the first common electrode layer under the metal unit is thinned. Therefore, the crystallization thickness of the first common electrode layer is reduced, and the difficulty of etching the first common electrode layer is reduced, thereby reducing the risk of remaining of the first common electrode layer.

17 Claims, 4 Drawing Sheets

(56) References Cited

U.S. PATENT DOCUMENTS

| | | | | |
|---|---|---|---|---|
| 2017/0097534 A1* | 4/2017 | Shin | .................. | G02F 1/133377 |
| 2017/0373102 A1* | 12/2017 | Choi | ........................ | H01L 21/77 |
| 2018/0190944 A1* | 7/2018 | Lee | ...................... | H10K 50/865 |
| 2020/0119120 A1* | 4/2020 | Feng | .................... | H10K 59/126 |
| 2020/0209663 A1* | 7/2020 | Cheng | .............. | G02F 1/136209 |
| 2020/0321427 A1* | 10/2020 | Park | .................. | H10K 59/1315 |
| 2021/0223613 A1* | 7/2021 | Lee | ................... | G02F 1/133502 |
| 2022/0181356 A1* | 6/2022 | Suzuki | ............. | H01L 29/66742 |

FOREIGN PATENT DOCUMENTS

| | | | |
|---|---|---|---|
| CN | 205427390 | | 8/2016 |
| CN | 106019751 | | 10/2016 |
| CN | 106814513 | | 6/2017 |
| CN | 108305879 | | 7/2018 |
| CN | 110828476 | | 2/2020 |
| JP | 2015-118982 | | 6/2015 |
| JP | 2015118982 A | * | 6/2015 |

OTHER PUBLICATIONS

Notification of Office Action and Search Report Dated Nov. 24, 2022 From the State Intellectual Property Office of the People's Republic of China Re. Application No. 202111211215.4 and Its Translation Into English. (21 Pages).

* cited by examiner

ARRAY SUBSTRATE WITH SECOND COMMON ELECTRODE LAYER AND PREPARATION METHOD THEREOF, AND DISPLAY PANEL

RELATED APPLICATIONS

This application is a National Phase of PCT Patent Application No. PCT/CN2021/126434 having International filing date of Oct. 26, 2021, which claims the benefit of priority of Chinese Patent Application No. 202111211215.4 filed on Oct. 18, 2021. The contents of the above applications are all incorporated by reference as if fully set forth herein in their entirety.

FIELD AND BACKGROUND OF THE INVENTION

The present disclosure relates to the field of display technologies, and in particular, to an array substrate and a preparation method thereof, and a display panel.

For conventional display devices adopting an HFS display mode, indium tin oxide (ITO) is usually used on a whole surface as a common electrode. Since the resistance of the common electrode is relatively greater, in a high-order display device, a Cu trace is usually required to prepared on the common electrode, to reduce the resistance of the common electrode. Currently, the Cu trace and the common electrode are usually prepared on a planarization layer (polyfluoroalkoxy, PFA). Since the Cu trace is in poor contact with the PFA, the Cu trace cannot be directly prepared on the PFA. The ITO is in well contact with the PFA, and the ITO does not easily fall off. Thus, the common electrode is usually first prepared on the PFA, and then the Cu trace is prepared on the common electrode.

SUMMARY OF THE INVENTION

The Cu trace is usually prepared using a physical vapor deposition (PVD) process, Cu is usually processed at 100□, and a film is generated after the PVD. Since Cu atoms bombard the indium tin oxide (ITO), the temperature of the ITO rises, resulting in crystallization of the ITO. After the crystallization of the ITO, etching with oxalic acid fails, so does etching with nitric and sulphuric acids. Therefore, a high risk of remaining of the ITO after etching is caused.

In addition, since the Cu trace is directly exposed from the surface of the common electrode, and annealing the common electrode causes oxidation to Cu, annealing cannot be performed on the common electrode. As a result, the resistance of the common electrode cannot be reduced, resulting in a large resistance of the common electrode.

The present invention is intended to provide an array substrate and a preparation method thereof, and a display panel. In the prior art, indium tin oxide (ITO) under Cu is easily crystallized and causes etching residues of the ITO, and the common electrode cannot be annealed, resulting in a relatively large resistance of the common electrode. By means of the present invention, the above problems can be resolved.

In order to resolve the above problems, the present invention provides an array substrate. The array substrate includes: a substrate; a thin film transistor layer, disposed on the substrate; a planarization layer, disposed on a surface of a side of the thin film transistor layer that is away from the substrate; a first common electrode layer, disposed on a surface of a side of the planarization layer that is away from the substrate; a metal unit, disposed on a surface of a side of the first common electrode layer that is away from the substrate; and a second common electrode layer, covering the metal unit and the surface of the side of the first common electrode layer that is away from the substrate.

Further, a thickness of the first common electrode layer is less than a thickness of the second common electrode layer.

Further, the thickness of the second common electrode layer ranges from 50 angstroms to 100 angstroms; and the thickness of the second common electrode layer ranges from 400 angstroms to 700 angstroms.

Further, a thickness of the metal unit ranges from 1000 angstroms to 3000 angstroms.

Further, the first common electrode layer, the metal unit, and the second common electrode layer connected to each other in parallel.

Further, the metal unit is disposed corresponding to a source electrode of the thin film transistor layer.

In order to resolve the above problems, the present invention further provides a method for preparing an array substrate. The method includes steps of: providing a substrate; preparing a thin film transistor layer on the substrate; preparing a planarization layer on a surface of a side of the thin film transistor layer that is away from the substrate; preparing a first common electrode layer on a surface of a side of the planarization layer that is away from the substrate; preparing a metal unit on a surface of a side of the first common electrode layer that is away from the substrate; and preparing a second common electrode layer on the metal unit and the surface of the side of the first common electrode layer that is away from the substrate.

Further, the method for preparing an array substrate further includes a step of: annealing the first common electrode layer and the second common electrode layer using an annealing process, to cause the first common electrode layer and the second common electrode layer to crystallize.

Further, a temperature range of the annealing process is from 180□ to 230□, and a time range of the annealing process is from 30 minutes to 90 minutes.

In order to resolve the above problems, the present invention further provides a display panel. The display panel includes the array substrate described in the present invention.

According to the present invention, the first common electrode layer under the metal unit is thinned. Therefore, the crystallization thickness of the first common electrode layer is reduced, and the difficulty of etching the first common electrode layer is reduced, thereby reducing the risk of remaining of the first common electrode layer. Since the second common electrode layer covers the metal unit, the metal unit is avoided from being oxidized during annealing. Therefore, resistances of the first common electrode layer and the second common electrode layer can be reduced by means of annealing.

BRIEF DESCRIPTION OF THE SEVERAL VIEWS OF THE DRAWINGS

To describe the technical solutions of the embodiments of the present disclosure more clearly, the following briefly introduces the accompanying drawings required for describing the embodiments. Apparently, the accompanying drawings in the following description show only some embodiments of the present disclosure, and a person skilled in the art may still derive other drawings from these accompanying drawings without creative efforts.

REFERENCE NUMERALS

100. Array substrate;
1. Substrate; 2. Thin film transistor layer;
3. First passivation layer; 4. Planarization layer;
5. First common electrode layer; 6. Metal unit;
7. Second common electrode layer; 8. Second passivation layer;
9. Pixel electrode layer;
21. Gate layer; 22. Gate insulating layer;
23. Active layer; 24. Source electrode;
25. Drain electrode.

DESCRIPTION OF SPECIFIC EMBODIMENTS OF THE INVENTION

The preferred embodiments of the present invention are described in detail with reference to the accompanying drawings, to completely introduce technical content of the present invention to a person skilled in the art and prove by examples that the present invention can be implemented, so that the technical content disclosed by the present invention is clearer, and a person skilled in the art may understand how to implement the present invention more easily. However, the present invention can be implemented through various embodiments in different forms, the protection scope of the present invention is not limited to the embodiments of the present invention, and illustration in the following is not used for limiting the scope of the present invention.

In the embodiments of the present invention, it should be understood that orientation terms such as "top", "bottom", "front", "rear", "left", "right", "inside", "outside", and "side surface" are merely orientations in the accompanying drawings, and are used only for illustrating and describing the present invention, but are not intended to limit the present invention.

In the accompanying drawings, components with the same structures are denoted by the same numerals, and components with similar structures or functions are denoted by similar numerals. In addition, for ease of understanding and description, the size and thickness of each component shown in the accompanying drawings are shown arbitrarily, and the size and thickness of each component are not limited in the present invention.

Embodiment 1

Figure 1:
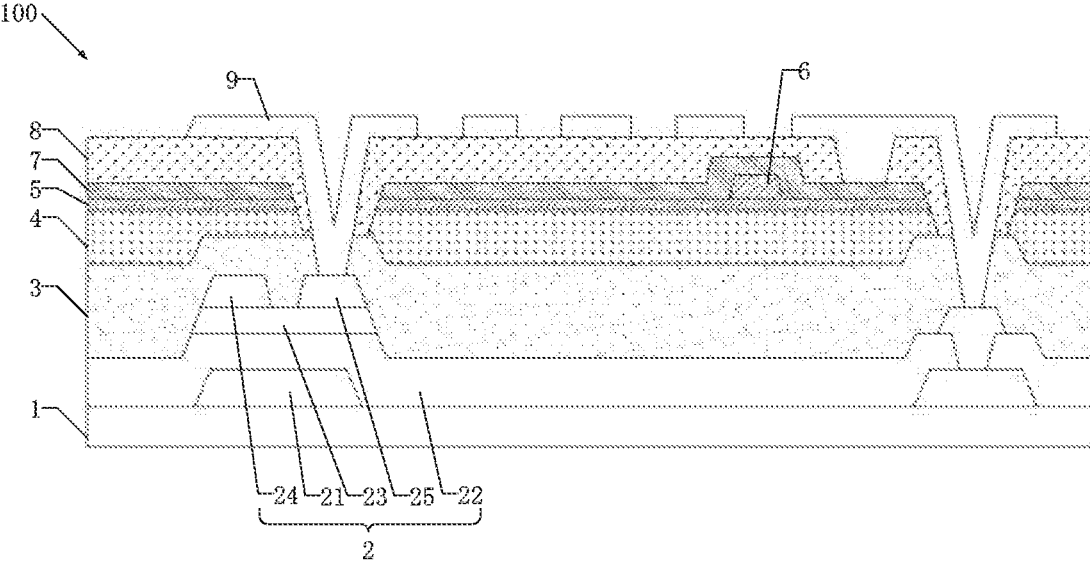
FIG. 1 is a schematic diagram of a structure of an array substrate according to Embodiment 1 of the present invention.
Figure 2:
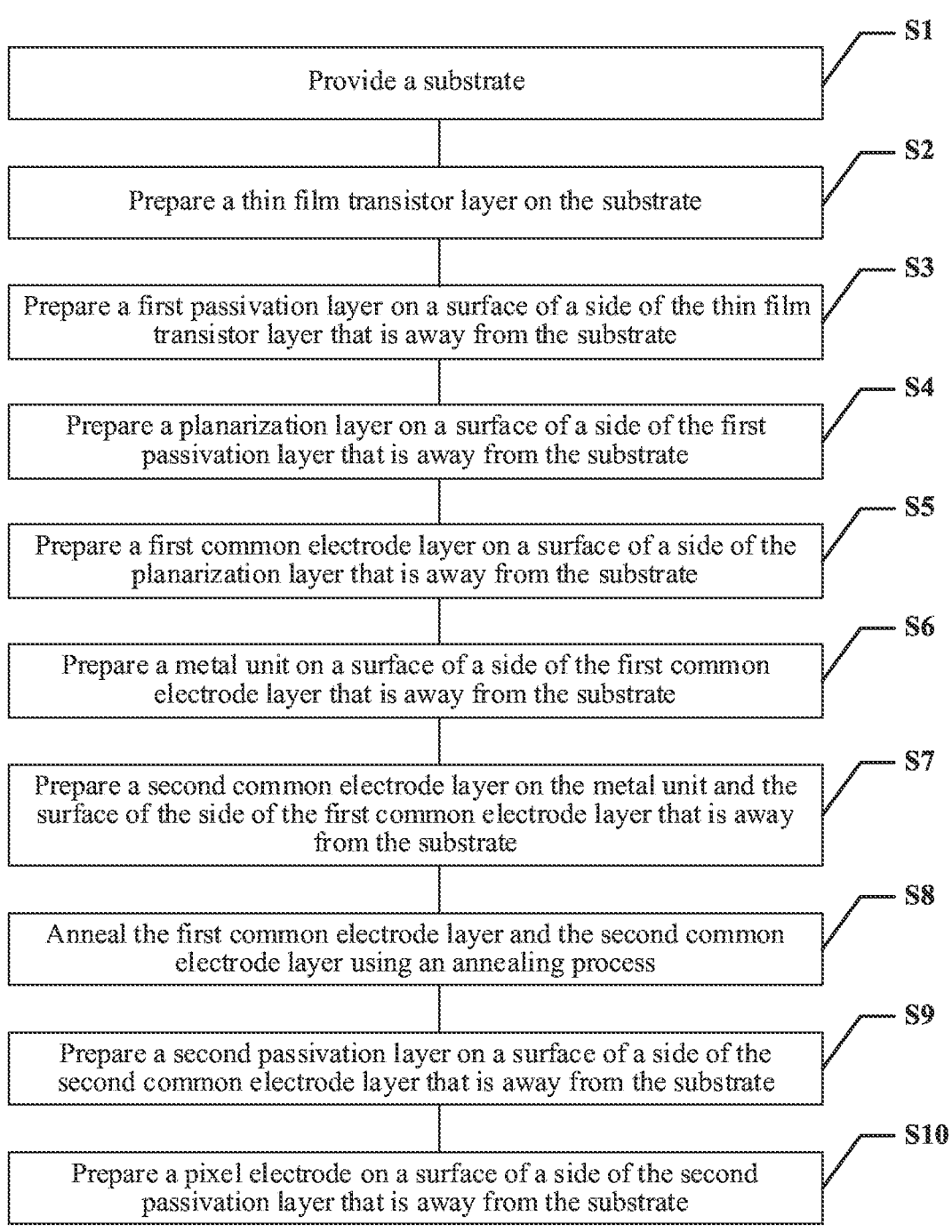
FIG. 2 is a diagram of steps for preparing an array substrate according to the present invention.
Figure 3:
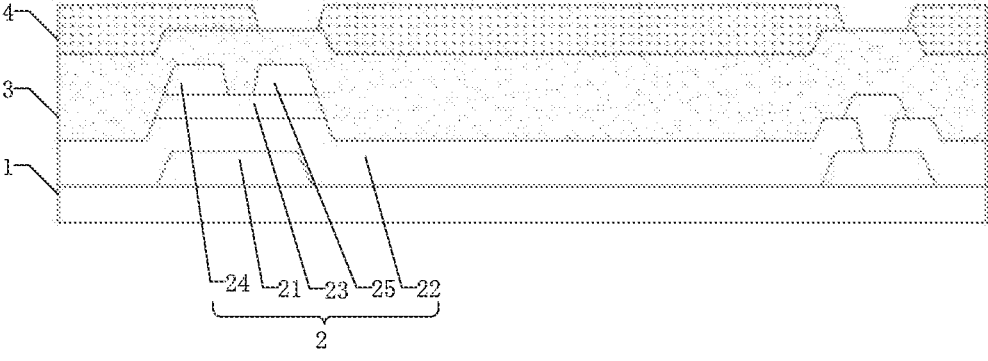
FIG. 3 is a schematic diagram of a structure after a thin film transistor layer, a first passivation layer, and a planarization layer are successively prepared on a substrate according to the present invention.
Figure 4:
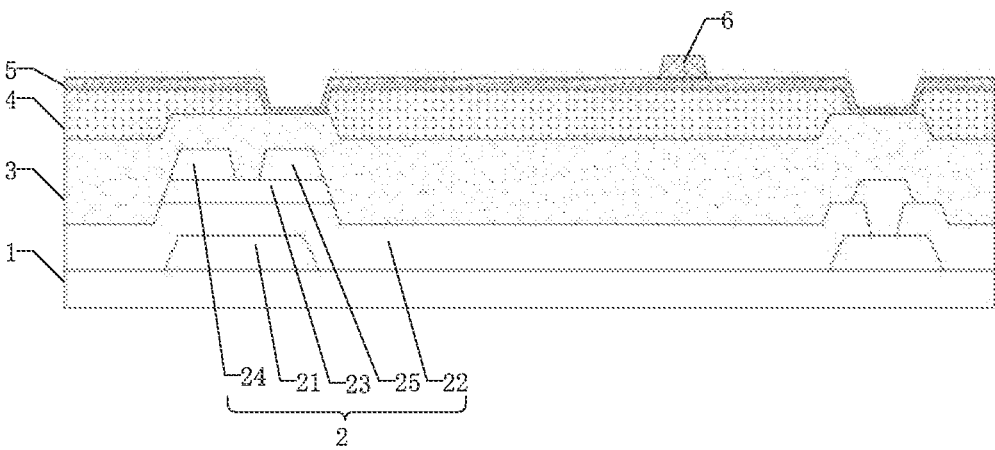
FIG. 4 is a schematic diagram of a structure after a first common electrode layer and a metal unit are prepared on the basis of FIG. 3.
Figure 5:
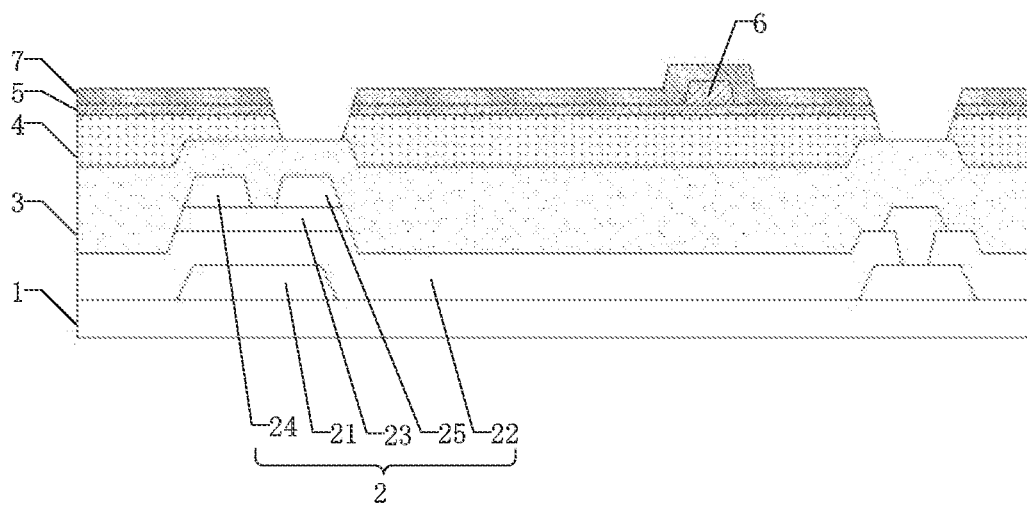
FIG. 5 is a schematic diagram of a structure after a second common electrode layer is prepared on the basis of FIG. 4 and the first common electrode layer and the second common electrode layer are etched.

As shown in FIG. 1, the present invention provides a display panel. The display panel includes an array substrate

100. The array substrate 100 includes a substrate 1, a thin film transistor layer 2, a first passivation layer 3, a planarization layer 4, a first common electrode layer 5, a metal unit 6, a second common electrode layer 7, a second passivation layer 8, and a pixel electrode layer 9.

In the present embodiment, the substrate 1 is made of glass. Therefore, the substrate 1 can effectively protect the array substrate 100. In other embodiments, the substrate 1 may be made of other materials. The material of the substrate 1 is not limited in the present disclosure.

As shown in FIG. 1, the thin film transistor layer 2 includes a gate layer 21, a gate insulating layer 22, an active layer 23, a source electrode 24, and a drain electrode 25.

As shown in FIG. 1, the gate layer 21 is disposed on the substrate 1. A material of the gate layer 21 includes one or more of Cu, Mo, Al, IZO, indium tin oxide (ITO), Ni, Mo, TiNi, NiCr, or CuNb.

As shown in FIG. 1, the gate insulating layer 22 covers a surface of a side of the gate layer 21 that is away from the substrate 1, and extends to cover the substrate 1. The gate insulating layer is mainly configured to prevent the gate layer 21 and the active layer 23 from coming into contact with each other and causing a short circuit. The gate insulating layer 22 includes one or more of SiOx, SiNx, or $Al_2O_3$.

As shown in FIG. 1, the active layer 23 is disposed on a surface of a side of the gate insulating layer 22 that is away from the substrate 1, and is disposed corresponding to the gate layer 21. The active layer 23 may be an oxide semiconductor or semiconductors of other types, such as IGZO, IGTO, IGO, IZO, or AIZO.

As shown in FIG. 1, the source electrode 24 and the drain electrode 25 are spaced apart from each other on a surface of a side of the active layer 23 that is away from the substrate 1. The source electrode 24 and the drain electrode 25 are electrically connected to the active layer 23. A material of each of the source electrode 24 and the drain electrode 25 includes one or more of Cu, Mo, Al, IZO, ITO, Ni, Mo, TiNi, NiCr, or CuNb.

As shown in FIG. 1, the first passivation layer 3 covers the source electrode 24 and the drain electrode 25, and extends to cover the active layer 23 and the gate insulating layer 22. The first passivation layer 3 includes one or more of SiOx, SiNx, or $Al_2O_3$. The first passivation layer 3 is mainly configured to prevent moisture, hydrogen, oxygen, and the like from diffusing into a channel of the thin film transistor layer 2, thereby guaranteeing the electrical properties and the stability of the devices of the thin film transistor layer 2.

As shown in FIG. 1, the planarization layer 4 is disposed on a surface of a side of the first passivation layer 3 that is away from the substrate 1. In the present embodiment, the planarization layer 4 is made of PFA. The planarization layer 4 is mainly configured to provide a planarization surface for a film layer above the planarization layer 4. The planarization layer 4 can further prevent the coupling between the first common electrode layer 5 on the planarization layer 4 and the source electrode 24 and the drain electrode 25 under the planarization layer.

As shown in FIG. 1, the first common electrode layer 5 is disposed on a surface of a side of the planarization layer 4 that is away from the substrate 1. In the present embodiment, the first common electrode layer 5 is made of ITO. In other embodiments, the first common electrode layer 5 may also be made of other transparent conductive oxides, such as TCO conductive glass (FTO for short).

A thickness of the first common electrode layer 5 is in a range of 50 angstroms to 100 angstroms. In the present embodiment, the thickness of the first common electrode layer 5 is 75 angstroms. The first common electrode layer 5 is thinned. Therefore, the crystallization thickness of the first common electrode layer 5 is reduced, and the difficulty of etching the first common electrode layer 5 is reduced, thereby reducing the risk of remaining of the first common electrode layer 5.

As shown in FIG. 1, the metal unit 6 is disposed on a surface of a side of the first common electrode layer 5 that is away from the substrate 1. A thickness of the metal unit 6 is in a range of 1000 angstroms to 3000 angstroms. Since Cu has a low price and a small resistance, the metal unit 6 in the present embodiment is made of Cu. In other embodiments, the metal unit 6 may also be made of Al, Ag, or the like.

As shown in FIG. 1, the second common electrode layer 7 covers the metal unit 6 and the surface of the side of the first common electrode layer 5 that is away from the substrate 1. In the present embodiment, the second common electrode layer 7 is made of ITO. In other embodiments, the second common electrode layer 7 may also be made of other transparent conductive oxides, such as TCO conductive glass (FTO for short). A thickness of the second common electrode layer 7 is in a range of 400 angstroms to 700 angstroms.

To sum up, since the second common electrode layer 7 covers the metal unit 6, the metal unit 6 is avoided from being oxidized during annealing. Therefore, resistances of the first common electrode layer 5 and the second common electrode layer 7 can be reduced by means of annealing.

As shown in FIG. 1, since an electric current is conducted transversely, and the first common electrode layer 5, the metal unit 6, and the second common electrode layer 7 are in contact with each other, the first common electrode layer 5, the metal unit 6, and the second common electrode layer 7 are connected to each other in parallel. An overall resistance after the first common electrode layer 5, the metal unit 6, and the second common electrode layer 7 are connected to each other in parallel can be less than a resistance of the first common electrode layer 5, a resistance of the metal unit 6, and a resistance of the second common electrode layer 7.

As shown in FIG. 1, the second passivation layer 8 covers a surface of a side of the second common electrode layer 7 that is away from the substrate 1. The second passivation layer 8 includes one or more of SiOx, SiNx, or $Al_2O_3$. The second passivation layer 8 may be configured to prevent the pixel electrode 9 and the second common electrode layer 7 from being connected and causing a short circuit and to block moisture.

As shown in FIG. 1, the pixel electrode 9 is disposed on a surface of a side of the second passivation layer 8 that is away from the substrate 1. The pixel electrode 9 is electrically connected to the drain electrode 25 of the thin film transistor layer 2. As shown in FIGS. 2 to 5, the present invention further provides a method for preparing an array substrate 100. The method includes the following steps: S1: Provide a substrate 1. S2: Prepare a thin film transistor layer 2 on the substrate 1. S3: Prepare a first passivation layer 3 on a surface of a side of the thin film transistor layer 2 that is away from the substrate 1. S4: Prepare a planarization layer 4 on a surface of a side of the first passivation layer 3 that is away from the substrate 1. S5: Prepare a first common electrode layer 5 on a surface of a side of the planarization layer 4 that is away from the substrate 1. S6: Prepare a metal unit 6 on a surface of a side of the first common electrode layer 5 that is away from the substrate 1. S7: Prepare a second common electrode layer 7 on the metal unit 6 and the surface of the side of the first common electrode layer 5 that is away from the substrate 1. S8: Anneal the first common electrode layer 5 and the second common electrode layer 7 using an annealing process. S9: Prepare a second passivation layer 8 on a surface of a side of the second common electrode layer 7 that is away from the substrate 1. S10: Prepare a pixel electrode 9 on a surface of a side of the second passivation layer 8 that is away from the substrate 1.

A temperature range of the annealing process in S8 is from 180□ to 230□, and a time range of the annealing process is from 30 minutes to 90 minutes. The first common electrode layer 5 and the second common electrode layer 7 are caused to crystallize, thereby reducing resistances of the first common electrode layer 5 and the second common electrode layer 7.

Embodiment 2

Figure 6:
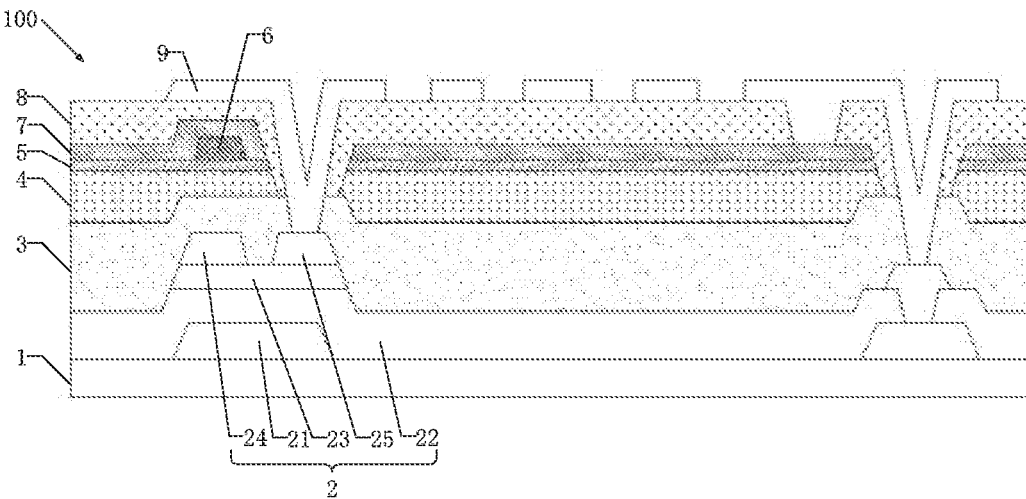
FIG. 6 is a schematic diagram of a structure of an array substrate according to Embodiment 2 of the present invention.

As shown in FIG. 6, Embodiment 2 includes all of the technical features of Embodiment 1. A difference between Embodiment 2 and Embodiment 1 lies in that, in Embodiment 2, the metal unit 6 is disposed corresponding to the source electrode 24 of the thin film transistor layer 2. A width of the metal unit 6 is equal to or less than a width of the source electrode 24. In the present embodiment, the width of the metal unit 6 is less than the width of the source electrode 24. In this way, a black matrix (BM) can shield the metal unit 6 while shielding the source electrode 24, without a need of increasing an area of the BM and occupying an additional opening area, so that the aperture rate is increased.

The array substrate and the preparation method thereof, and the display panel of the present disclosure are described above in detail. Although the principles and implementations of the present disclosure are described by using specific examples in this specification, the descriptions of the foregoing embodiments are merely intended to help understand the method and the core idea of the present disclosure. Meanwhile, a person skilled in the art may make modifications to the specific implementations and application range according to the idea of the present disclosure. In conclusion, the content of this specification is not construed as a limitation to the present disclosure.

What is claimed is:

1. An array substrate, comprising:
   a substrate;
   a thin film transistor layer disposed on the substrate;
   a planarization layer disposed on a surface of a side of the thin film transistor layer away from the substrate;
   a first common electrode layer, disposed on a surface of a side of the planarization layer away from the substrate;
   a metal unit disposed on a surface of a side of the first common electrode layer away from the substrate; and
   a second common electrode layer covering the metal unit and the surface of the side of the first common electrode layer away from the substrate;
   wherein a laminated structure consisting of the first common electrode layer, the metal unit, and the second common electrode layer is insulated from a thin film transistor of the thin film transistor layer; and wherein the orthographic projection of the metal unit on the substrate is within an orthographic projection of the thin film transistor layer on the substrate.

2. The array substrate as claimed in claim 1, wherein a thickness of the first common electrode layer is less than a thickness of the second common electrode layer.

7

8

3. The array substrate as claimed in claim 2, wherein the thickness of the first common electrode layer ranges from 50 angstroms to 100 angstroms, and the thickness of the second common electrode layer ranges from 400 angstroms to 700 angstroms.

4. The array substrate as claimed in claim 1, wherein a thickness of the metal unit ranges from 1000 angstroms to 3000 angstroms.

5. The array substrate as claimed in claim 1, wherein the first common electrode layer, the metal unit, and the second common electrode layer are connected to each other in parallel.

6. The array substrate as claimed in claim 1, wherein a surface of a side of the second common electrode layer close to the substrate is in contact with the surface of the side of the first common electrode layer away from the substrate.

7. The array substrate as claimed in claim 1, wherein the metal unit is disposed corresponding to a source of the thin film transistor layer, and a width of the metal unit is equal to or less than a width of the source of the thin film transistor layer.

8. The array substrate as claimed in claim 1, wherein the array substrate further comprises a via hole penetrating through the second common electrode layer, the first common electrode layer, and the planarization layer, an orthographic projection of the via hole on the substrate overlaps an orthographic projection of a drain of the thin film transistor layer on the substrate, and an orthographic projection of the metal unit on the substrate does not overlap the orthographic projection of the via hole on the substrate.

9. A method for preparing an array substrate, comprising following steps:

providing a substrate;
　preparing a thin film transistor layer on the substrate;
　preparing a planarization layer on a surface of a side of the thin film transistor layer away from the substrate;
　preparing a first common electrode layer on a surface of a side of the planarization layer away from the substrate;
　preparing a metal unit on a surface of a side of the first common electrode layer away from the substrate; and
　preparing a second common electrode layer on the metal unit and the surface of the side of the first common electrode layer away from the substrate;
　wherein a laminated structure consisting of the first common electrode layer, the metal unit, and the second common electrode layer is insulated from a thin film transistor of the thin film transistor layer; and wherein the orthographic projection of the metal unit on the substrate is within an orthographic projection of the thin film transistor layer on the substrate.

10. The method for preparing an array substrate as claimed in claim 9, wherein the method further comprises a step of annealing the first common electrode layer and the second common electrode layer using an annealing process, to cause the first common electrode layer and the second common electrode layer to crystallize.

11. The method for preparing an array substrate as claimed in claim 10, wherein a temperature range of the annealing process is from 180° C. to 230° C., and a time range of the annealing process is from 30 minutes to 90 minutes.

12. A display panel, comprising an array substrate, wherein the array substrate comprises:

a substrate;
　a thin film transistor layer disposed on the substrate;
　a planarization layer disposed on a surface of a side of the thin film transistor layer away from the substrate;
　a first common electrode layer disposed on a surface of a side of the planarization layer away from the substrate;
　a metal unit disposed on a surface of a side of the first common electrode layer away from the substrate; and
　a second common electrode layer covering the metal unit and the surface of the side of the first common electrode layer away from the substrate;
　wherein a laminated structure consisting of the first common electrode layer, the metal unit, and the second common electrode layer is insulated from a thin film transistor of the thin film transistor layer; and wherein the orthographic projection of the metal unit on the substrate is within an orthographic projection of the thin film transistor layer on the substrate.

13. The display panel as claimed in claim 12, wherein a thickness of the first common electrode layer is less than a thickness of the second common electrode layer.

14. The display panel as claimed in claim 13, wherein the thickness of the first common electrode layer ranges from 50 angstroms to 100 angstroms; and the thickness of the second common electrode layer ranges from 400 angstroms to 700 angstroms.

15. The display panel as claimed in claim 12, wherein a thickness of the metal unit ranges from 1000 angstroms to 3000 angstroms.

16. The display panel as claimed in claim 12, wherein the first common electrode layer, the metal unit, and the second common electrode layer are connected to each other in parallel.

17. The display panel as claimed in claim 12, wherein a surface of a side of the second common electrode layer close to the substrate is in contact with the surface of the side of the first common electrode layer away from the substrate.

* * * * *